United States Patent [19]
Kumagai et al.

[11] Patent Number: 5,548,811
[45] Date of Patent: Aug. 20, 1996

[54] AUTOMATIC FREQUENCY CONTROL CIRCUIT SELECTIVELY USING FREQUENCY-DIVIDED LOCAL OSCILLATOR SIGNAL OR PILOT SIGNAL

[75] Inventors: Yoshiaki Kumagai; Eiji Itaya; Yoichi Endo, all of Kawasaki, Japan

[73] Assignee: Fujitsu Limited, Kawasaki, Japan

[21] Appl. No.: 336,205

[22] Filed: Nov. 3, 1994

Related U.S. Application Data

[63] Continuation of Ser. No. 901,150, Jun. 19, 1992, abandoned.

[30] Foreign Application Priority Data

Jun. 19, 1991 [JP] Japan ................................. 3-147257
Jun. 21, 1991 [JP] Japan ................................. 3-150381

[51] Int. Cl.$^6$ ................................................ H04B 01/18
[52] U.S. Cl. ........................ 455/192.2; 455/196.1; 455/260; 455/264; 455/318
[58] Field of Search ........................ 455/192.2, 192.3, 455/196.1, 255, 256, 257, 258, 259, 260, 264, 265, 318, 182.1, 182.2, 183.1, 200.1; 358/194

[56] References Cited

U.S. PATENT DOCUMENTS

| | | | |
|---|---|---|---|
| 4,247,952 | 1/1981 | Shibuya | 455/200.1 |
| 4,352,205 | 9/1982 | Kato et al. | 455/183 |
| 4,691,377 | 9/1987 | Yoshihara et al. | 455/256 |

FOREIGN PATENT DOCUMENTS

| | | |
|---|---|---|
| 0075332A2 | 9/1981 | European Pat. Off. . |
| 0075332A3 | 9/1981 | European Pat. Off. . |
| 0199887A3 | 5/1985 | European Pat. Off. . |
| 0199887A2 | 5/1985 | European Pat. Off. . |

*Primary Examiner*—Reinhard J. Eisenzopf
*Assistant Examiner*—Philip J. Sobutka
*Attorney, Agent, or Firm*—Staas & Halsey

[57] ABSTRACT

An automatic frequency control (AFC) circuit receives input signals and generates converted signals by mixing the input signals with a local oscillation signal. An extraction circuit extracts a pilot signal, if present, from the input signals and provides the pilot signal to a switch. A frequency divider divides a frequency of the local oscillation signal output from a voltage control oscillator, and provides the frequency-divided local oscillation signal to the switch. The output of the switch is compared with a reference frequency in a phase comparator which generates a comparison result which controls the voltage controlled oscillator. If the pilot signal is not present, the switch selects the frequency-divided oscillation signal, to construct a phase-locked loop to stabilize the frequency of the local oscillation signal. Alternatively, an AFC circuit includes a frequency divider for selectively dividing a frequency of a pilot signal included in the converted signal. Various frequencies of the pilot signal can be received by altering a division number in the frequency divider.

13 Claims, 18 Drawing Sheets

AUTOMATIC FREQUENCY CONTROL CIRCUIT SELECTIVELY USING FREQUENCY-DIVIDED LOCAL OSCILLATOR SIGNAL OR PILOT SIGNAL

This application is a continuation of application Ser. No. 07/901,150, filed Jun. 19, 1992, now abandoned.

BACKGROUND OF THE INVENTION

1. Field of the Invention

The present invention relates to an automatic frequency control (AFC) circuit for use in a receiver of radio communication or satellite communication equipment. More particularly, the present invention is concerned with an AFC circuit providing frequency stability sufficient for use in a receiver in a single channel per carrier (SCPC) system.

2. Description of the Related Art

In a SCPC system, since a bandwidth occupied by a single channel is very narrow (several dozen kHz) compared with a carrier frequency (more than several hundred MHz), and tends to be narrower every year to raise the utilization factor of frequencies, a high level of stability of a received frequency is strongly recommended to ensure stable communication.

However, the stability of a frequency of a signal received from a satellite is limited to a certain level because of unstable influences from a local oscillator mounted on the satellite, the Doppler effect, and the instability of a high-frequency circuit of a receiver.

Therefore, an AFC system is employed to ensure stable communication. In the AFC system, a pilot signal not including modulation components is transmitted in a specific frequency position within the used band, and the frequency of a local oscillator of the receiver is automatically controlled so that the frequency of a received pilot signal is converted into a precise frequency in a frequency converter.

The local oscillator consists of a voltage controlled oscillator (VCO). A received radio-frequency signal or an intermediate frequency signal is converted into an intermediate frequency signal or a lower intermediate frequency signal respectively by being mixed with an output of the VCO in the frequency converter. The pilot signal is extracted from an output of the frequency converter through a band pass filter having a narrow passband and is compared with a reference frequency output from a reference oscillator in a phase comparator. An output of the phase comparator is applied through a loop filter to the VCO as a control signal, to thereby control the frequency and the phase of the extracted pilot signal so as to be equal to those of the reference signal. Since frequencies of the other received signals within that band fluctuate simultaneously with the received pilot signal, the fluctuations of the other received signals are compensated for in converted signals.

Usually, the pilot signal is transmitted only from a master station or a reference station supervising a whole communication network. Therefore, the pilot signal is not obtained when a transmission of the pilot signal is terminated for some reason or other, when the receiver is used in a system where the pilot signal is not transmitted, or when a loop test is carried out within a part of the transmission paths.

Conventionally, in order to maintain receiver functions even when the pilot signal is not obtained, a switch is provided between the VCO and the loop filter for selecting the output of the loop filter or a fixed bias voltage. If the pilot signal is obtained, the switch is set so as to select the output of the loop filter, and if the pilot signal is not obtained, the switch is set so as to select the fixed bias voltage.

In the above construction, since frequency stability of outputs of the frequency converter is determined by the stability of the VCO while the pilot signal is not obtained, a high level of stability is required in the VCO. However, since the stability of the VCO is determined by an oscillation frequency, a variable range, and the quality factor (Q) of a resonator, etc., it is very difficult to obtain a VCO having a high level of stability as well as an ultra high operating frequency (more than several hundred MHz) and a variable range necessary for searching over the assigned frequency band to catch the pilot signal. For example, frequency stability of $10^{-6}$ is realized by using a crystal oscillator as a reference oscillator when the pilot signal is obtained, whereas the same frequency stability cannot be realized in practice when the pilot signal is not obtained, because frequency stability of the VCO is generally about $10^{-4}$. In this case, if the output frequency of the VCO is 1,120 MHz to convert 1,190 MHz into 70 MHz, the output frequency of the VCO fluctuates over a range of 112 kHz (1,120 MHz× $10^{-4}$). Therefore, if the bandwidth of a channel is 45 kHz, a designated channel cannot be received because the width of the fluctuation is larger than the bandwidth.

Meanwhile, the band pass filter for extracting the pilot signal from the output of the frequency converter has a narrow passband such that the width of a 3 dB passband is, for example, 30 kHz in a 80 MHz band, and a crystal filter is often used as the band pass filter. Although a single frequency is usually used as the frequency of the pilot signal, a spare frequency is reserved in another frequency in some systems, and it is previously announced that the spare frequency will be used for the pilot signal when the pilot signal in the current frequency is terminated for some reason or other. In that system, if the frequency of the pilot signal is switched from current to spare, a central frequency of the band pass filter and the frequency of the reference oscillator must be changed in accordance with the changed pilot frequency.

The change may be possible if a plurality of the band pass filters and the reference oscillators having individual frequencies are provided within the receiver and each one of those is selected according to the pilot frequency. However, this solution is not economical because the band pass filters having a narrow passband, such as the crystal filters, are often expensive and the reference oscillator is also expensive.

Alternatively, the change may also be possible by exchanging the band pass filters and the reference oscillators according to the pilot frequency. However, the exchange of the filters and oscillators requires the shutdown of the system and requires excessive labor for the shutdown and exchange.

The problem of changing the pilot frequency also arises when the pilot frequency is unknown at the stage of shipping because the pilot frequency is not unique but is different if the satellite used or manner of usage thereof is different.

Furthermore, if the pilot frequency is not a typical value, an oscillator specially made to order must be used as the reference oscillator. The specially made oscillator is more expensive than typical oscillators.

SUMMARY OF THE INVENTION

It is an object of the present invention to provide an AFC circuit that enables precise frequency control even when a pilot signal is not obtained.

It is another object of the present invention to provide an AFC circuit that can deal with a discrepancy or a change of a pilot frequency without an exchange of filters and oscillators or the provision of various filters and oscillators.

It is still another object of the present invention to provide an AFC circuit, wherein a typical low cost oscillator can be used even when the pilot frequency is not of typical value.

In accordance with the present invention there is provided an automatic frequency control circuit for converting frequencies of input signals into automatically controlled stable frequencies, comprising frequency conversion means for converting the frequencies of the input signals into frequencies different than that of input signals by mixing a local oscillation signal with the input signals, extraction means for extracting a pilot signal having a specific frequency from signals output from the frequency conversion means, oscillation means for outputting a reference signal having a reference frequency, phase comparison means having a first and a second input terminals for comparing a frequency and a phase of the reference signal input from the first input terminals with those of a signal input from the second input terminal, to thereby output a comparison result, variable oscillation means for outputting the local oscillation signal having a frequency varying in accordance with the comparison result output from the phase comparison means to the frequency conversion means, frequency division means for dividing the frequency of the local oscillation signal by a division number to thereby output a frequency-divided local oscillation signal, and switch means for selecting an output of the extraction means or the frequency-divided local oscillation signal output from the frequency division means to output the selected signal to the second input terminal of the phase comparison means.

In accordance with the present invention there is also provided an automatic frequency control circuit for converting frequencies of input signals, including a pilot signal, into automatically stabilized frequencies, comprising frequency conversion means for converting the frequencies of the input signals into frequencies different than those of the input signals by mixing a local oscillation signal with the input signals, a first frequency divider for selectively dividing a frequency of the pilot signal by a first division number to thereby output a frequency-divided pilot signal, oscillation means for outputting a reference signal having a reference frequency, a first phase comparator for comparing a frequency and a phase of the reference signal output from the oscillation means with those of the frequency-divided pilot signal, to thereby output a comparison result, and a first variable oscillator for outputting the local oscillation signal having a frequency varying in accordance with the comparison result output from the first phase comparator to the frequency conversion means.

DESCRIPTION OF THE PREFERRED EMBODIMENTS

Figure 1:
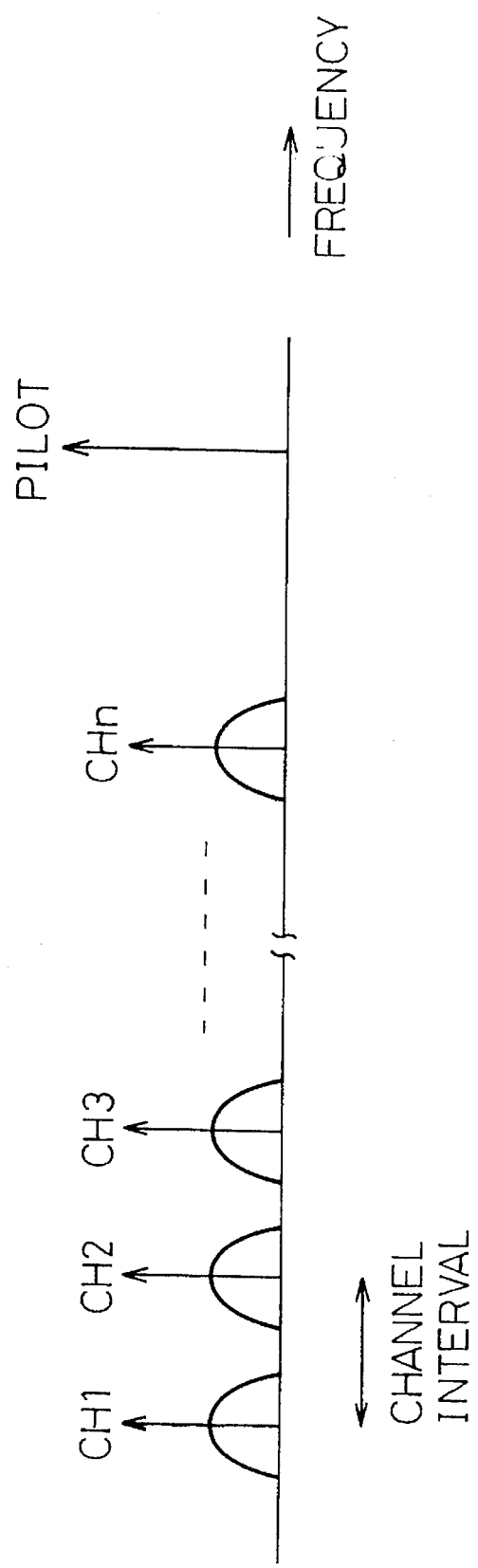
FIG. 1 is a diagram showing an example of disposition of signals in a SCPC system.

FIG. 1 shows an example of a disposition of signals in a received signal of a SCPC system. As shown in FIG. 1, channel slots CH1 to CHn for channel 1 to channel n are assigned at constant channel intervals and a pilot signal from a reference station is transmitted in a frequency position within the band. In an AFC circuit, a frequency of a local oscillator is controlled so that a frequency of the received pilot signal is converted into a frequency equal to a frequency of a reference oscillator. Since frequencies of received signals of the channel 1 to the channel n fluctuate simultaneously with that of the received pilot signal, the fluctuations of the frequencies of the received signals are compensated in the converted signals.

Figure 2:
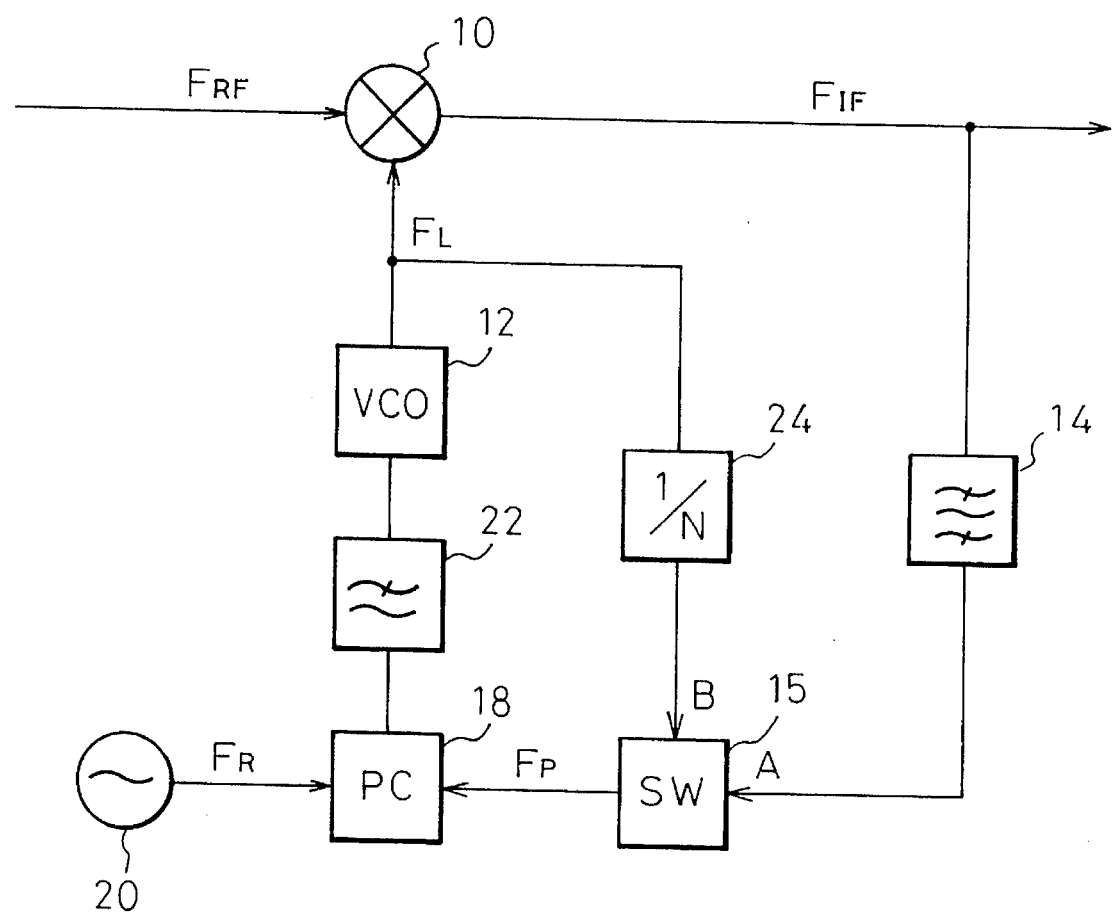
FIG. 2 is a block diagram showing a construction of an AFC circuit according to an embodiment of the present invention.

FIG. 2 is a block diagram showing a construction of an AFC circuit according to an embodiment of the present invention.

A radio frequency signal having a frequency of $f_{RF}$ or an intermediate frequency signal is mixed in a frequency converter 10 with an output signal of a voltage controlled oscillator (VCO) 12, to be converted into an intermediate frequency signal having a frequency of $f_{RF}$ or a lower intermediate frequency signal respectively. The output signals of the frequency converter 10 branch in a branching circuit (not shown) and the pilot signal contained in the branch signal is extracted through a band pass filter 14 having a narrow passband. The extracted pilot signal is input to one input terminal A of a manual switch 15. While the manual switch 15 selects the terminal A, the extracted pilot signal having a frequency of $f_P$ is input to one input terminal of a phase comparator 18. A reference signal having a frequency of $f_r$ is generated in a reference oscillator 20 and is input to another input terminal of the phase comparator 18. The phase comparator 18 compares frequency and phase of the two input signals and outputs the comparison result through a loop filter 22 to the VCO 12 as a control voltage. An output signal having a frequency of $f_L$ is fed from the VCO 12 to the frequency converter 10. The signal $f_L$ is also fed to a frequency divider 24. The frequency-divided signal is fed to another input terminal B of the manual switch 15.

While the pilot signal is obtained, an AFC loop similar to the conventional AFC circuit is constructed by setting the manual switch 15 so as to select the terminal A (AFC-ON).

When the pilot signal is not obtained, the manual switch 15 is set so as to select the terminal B (AFC-OFF). Then, as a phase lock loop (PLL) is constructed, a stable frequency $f_L$ based on the reference frequency $f_r$ is obtained. The frequencies $f_F$ and $f_r$ are designed so that $f_L$ is an integral multiple of It. The division number N of the frequency divider 24 is given as $$N = f_L / f_r \quad (1)$$

For example, if the input frequency $f_{RF}$ of the frequency converter 10 is 1,190 MHz, the output frequency $f_{IF}$ is 70 MHz, the output frequency $f_L$ of the VCO 12 is 1,120 MHz, and the pilot signal exists at the center of the frequency band, then the pilot frequency $f_p$ becomes 70 MHz.

While the manual switch 15 selects the terminal A, the local frequency $f_L$ is controlled by the error signal from the phase comparator 18 so that $\eta_p$ becomes equal to $f_r$. If the reference frequency $f_r$ is 70 MHz, the output frequency $f_{IF}$ is kept to 70 MHz by varying the local frequency $f_L$ nearly at 1,120 MHz even when the input frequency $f_{RF}$ fluctuates. When frequency stability of the reference oscillator 20 is $1 \times 10^{-7}$, the same stability is obtained in $f_{IF}$.

While the manual switch 15 selects the terminal B, an output signal of the frequency divider 24 having a frequency of $f_p = f_L/N$, i.e., 70 MHz where N=16, is fed to one input terminal of the phase comparator 18, and the VCO 12 is controlled so that $f_p$ becomes equal to Since the output signal of the VCO 12 is in phase-synchronism with the output signal of the reference oscillator 20, frequency stability of the VCO 12 becomes equal to that of the reference oscillator 20, i.e., $1 \times 10^{-7}$, or 112 Hz for $f_L$=1,120 MHZ.

Figure 3:
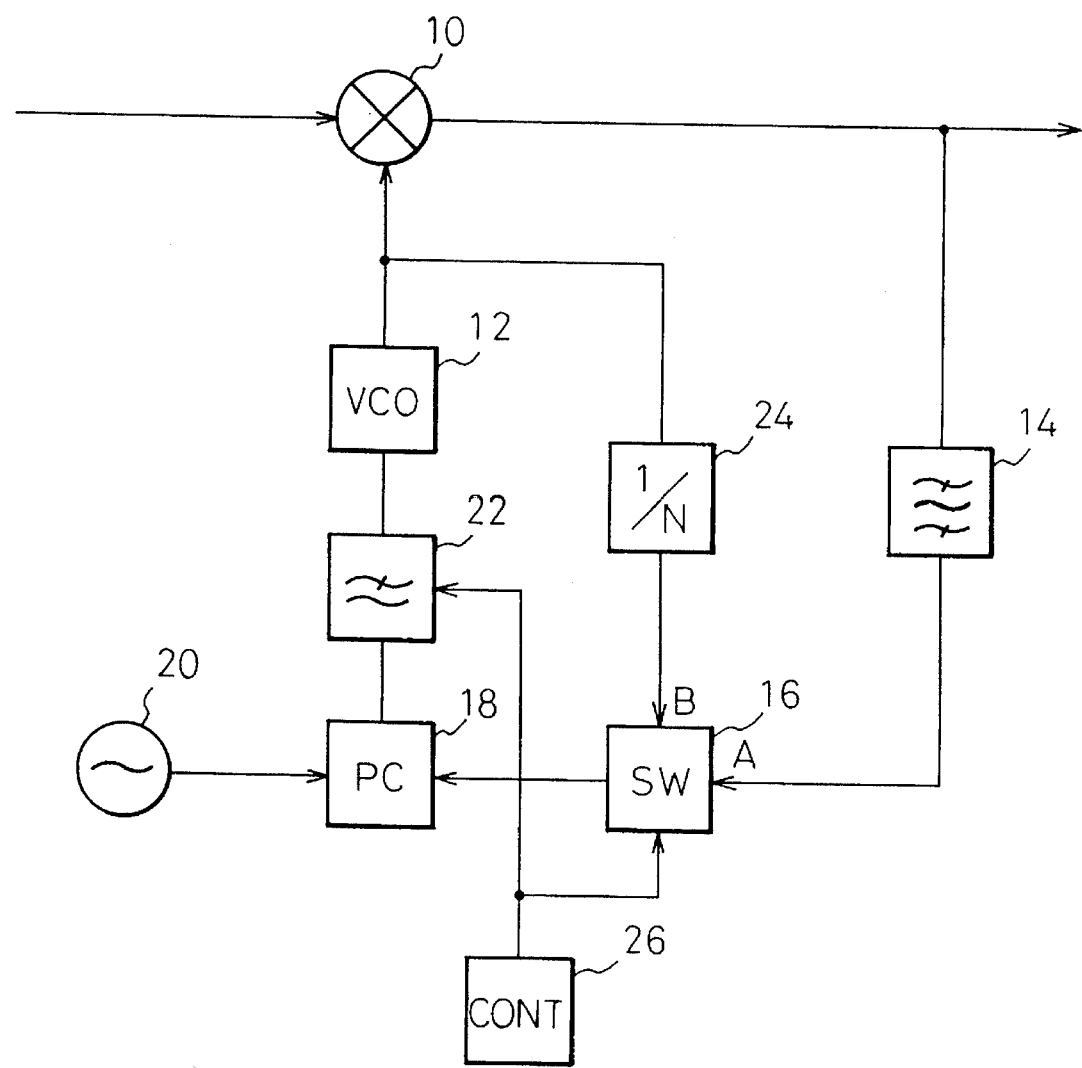
FIG. 3 is a block diagram showing a construction of an AFC circuit as a modification of the AFC circuit of FIG. 2.

FIG. 3 is a block diagram showing a construction of an AFC circuit as a modification of the AFC circuit of FIG. 2. In the AFC circuit of FIG. 3, a controller 26 is provided for switching parameters of the loop filter 22 simultaneously with switching of a switch 16 provided instead of the manual switch 15. If a response characteristic required in PLL during AFC-OFF is not equal to a response characteristic in AFC loop during AFC-ON, the simultaneous switching of the parameters of the loop filter 22 improves the response characteristic under optimum parameters.

Figure 4:
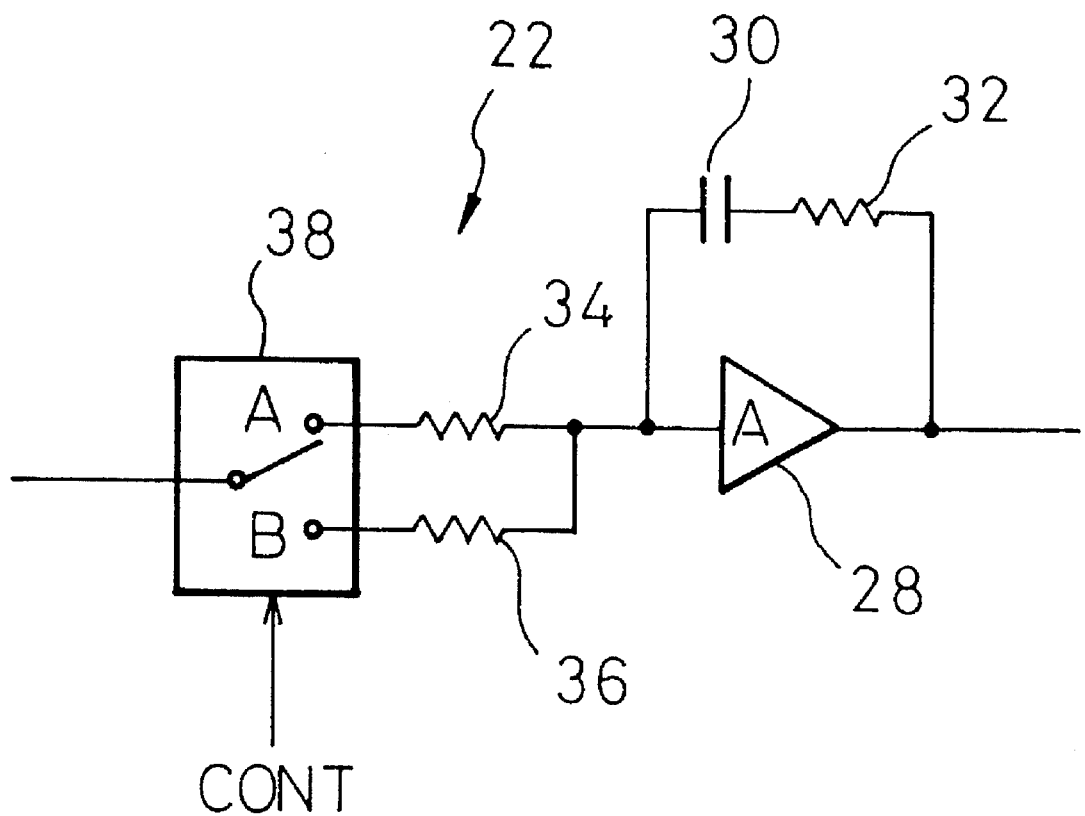
FIG. 4 is a circuit diagram of a loop filter 22 used in the AFC circuit of FIG. 3.

FIG. 4 is a circuit diagram of the loop filter 22 used in the AFC circuit of FIG. 3. The loop filter 22 includes an amplifier 28, a capacitor 30, and resistors 32, 34 to 36. The loop parameter of the loop filter 22 is determined by parameters of the capacitor 30, resistor 32 and resistor 34 or 36. By 10 switching a switch 38 in synchronism with the AFC ON/OFF, the response characteristic of the loop is altered. Thus, the optimum response characteristic is always obtained by altering the parameters of the loop filter 22 according to a distinction of the control loop in AFC ON/OFF.

Figure 5:
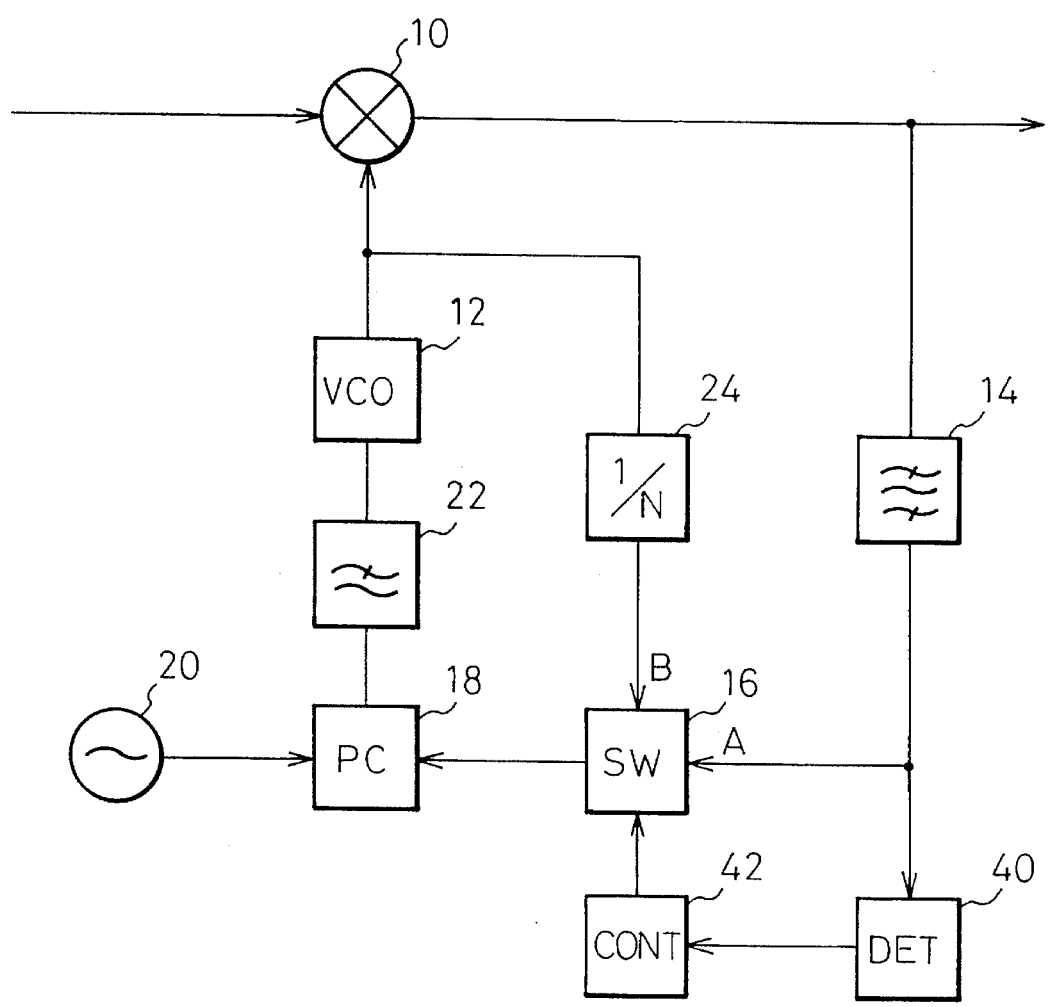
FIG. 5 is a block diagram showing a construction of an AFC circuit as another modification of the AFC circuit of FIG. 2.

FIG. 5 is a block diagram showing a construction of an AFC circuit as another modification of the AFC circuit of FIG. 2. A detector 40 detects the presence or absence of the pilot signal and a controller 42 controls the switch 16 according to an output signal of the detector 40. In the circuit of FIG. 5, when the detector 40 detects the interruption of the pilot signal, the controller 42 automatically changes the AFC loop to the PLL by controlling the switch 16, to thus obtain a stable output frequency of the VCO 12. Since the interruption of the pilot signal is also detected in the reference station and a system for transmitting the pilot signal is automatically swapped to a spare system, the pilot signal is again transmitted after a short interruption. Then, the detector 40 detects the pilot signal and the controller 42 automatically changes the PLL to the AFC loop.

Figure 6:
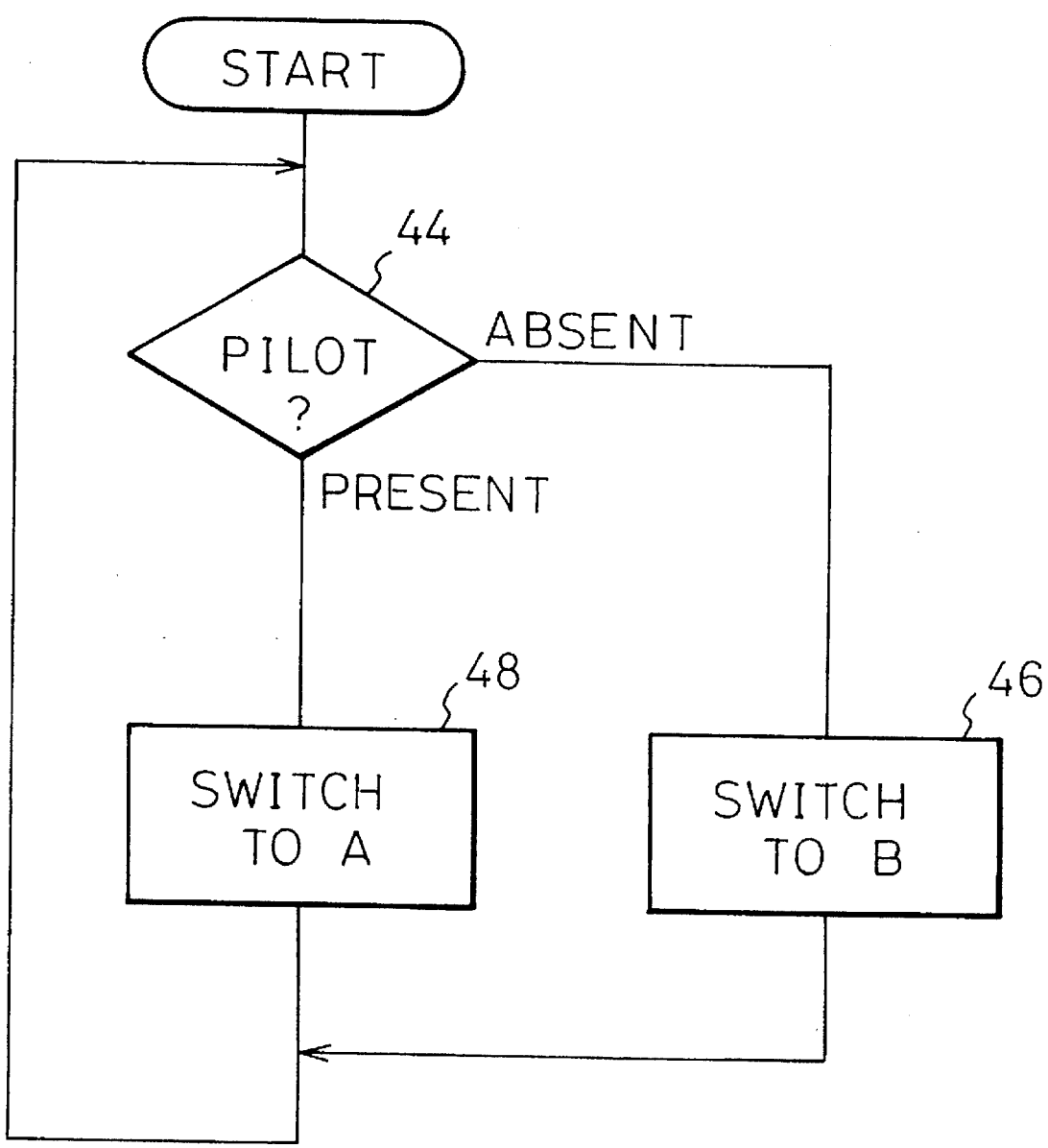
FIG. 6 is a flow chart showing a control process in the controller 42 of FIG. 5.

FIG. 6 is a flow chart showing the control process in the controller 42. In step 44, if the pilot signal is absent, the switch 16 is set so as to select the terminal B in step 46 to construct the PLL. If the pilot signal is present in step 44, the switch 16 is set so as to select the terminal A to construct the AFC loop in step 48.

Figure 7:
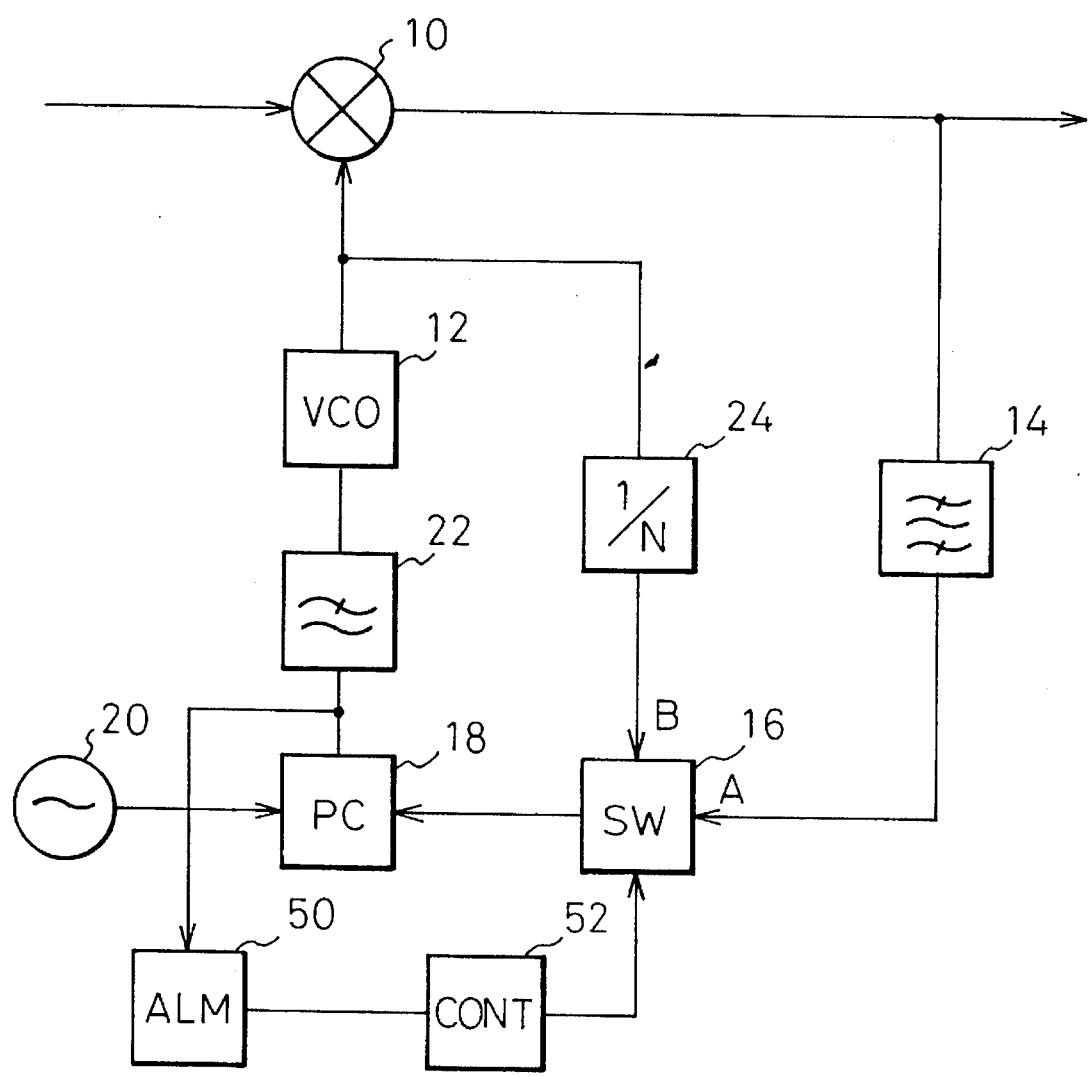
FIG. 7 is a block diagram showing a construction of an AFC circuit as another modification of AFC circuit of FIG. 2.

FIG. 7 is a block diagram showing a construction of an AFC circuit as another modification of the AFC circuit of FIG. 2. The AFC circuit of FIG. 7 comprises an alarm generator 50 for detecting an abnormal output of the phase comparator 18 and for outputting an alarm signal, and a controller 52 for controlling the switch 16 according to the alarm signal. When the pilot 10 signal is interrupted, the phase comparator 18 is latched to one side and outputs a maximum or minimum value. The alarm generator 50 detects this abnormal output and then outputs the alarm signal.

Figure 8A:
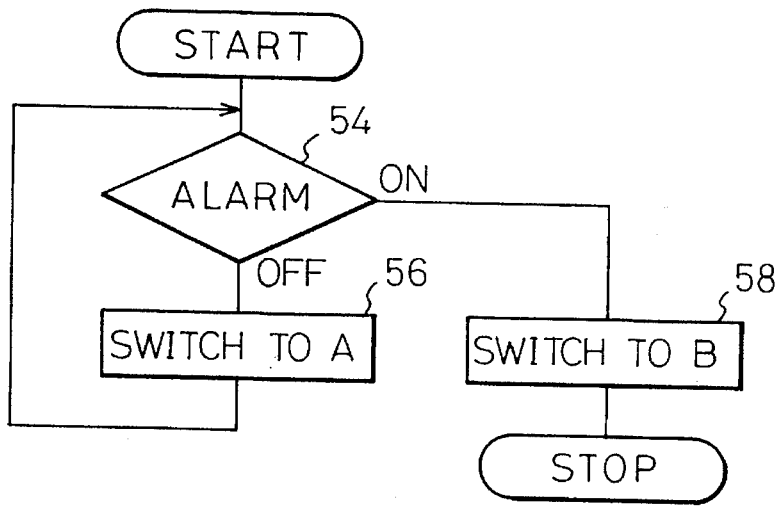
FIGS. 8A and 8B are flow charts showing examples of a control process in the controller 52 of FIG. 7.

FIG. 8A is a flow chart showing a first example of a control process in the controller 52. When the alarm is not output from the alarm generator 50 in step 54, the switch 16 is set so as to select the terminal A to construct the AFC loop in step 56. If the alarm is output in step 54, the switch 16 is set so as to select the terminal B to construct the PLL in step 58, and the control process stops until the process restarts.

Figure 8B:
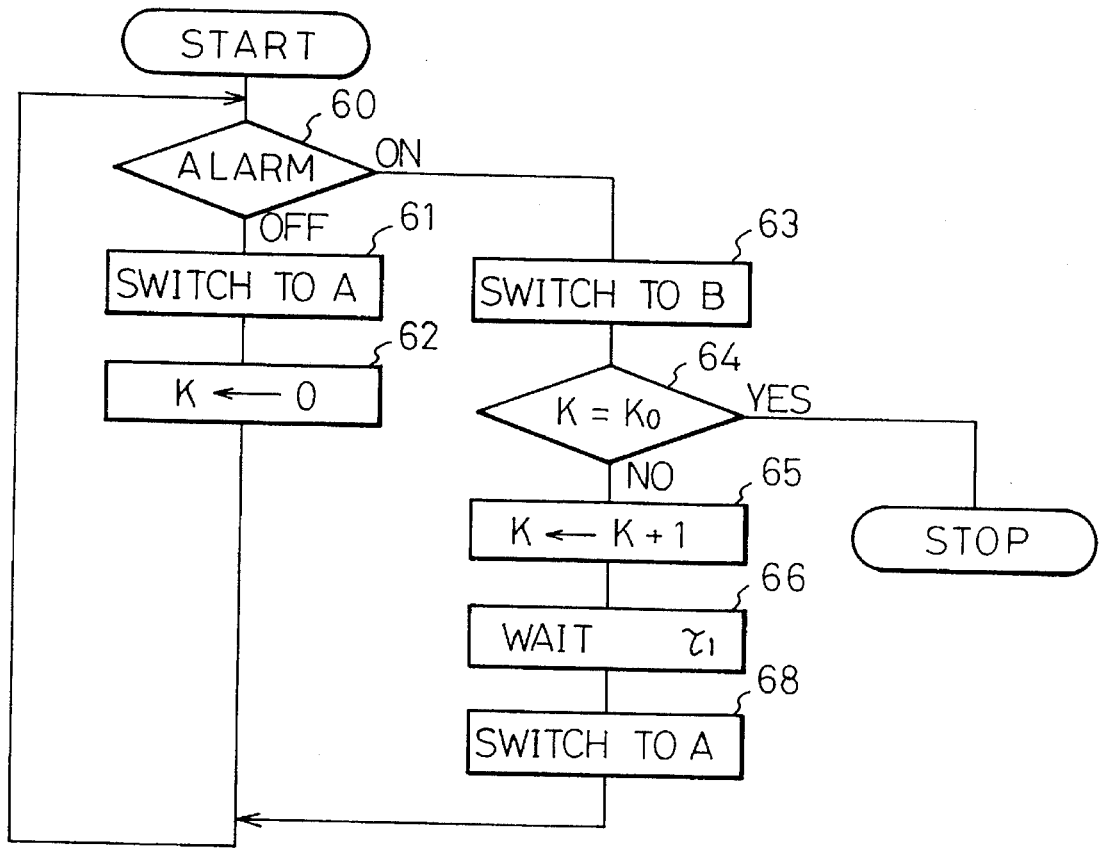

FIG. 8B is a flow chart showing a second example of a control process in the controller 52. When the alarm is not output from the alarm generator 50 in step 60, the switch 16 is set so as to select the terminal A in step 61 and a parameter K is reset to zero in step 62. If the alarm is output in step 60, the switch 16 is set so as to select the terminal B to construct the PLL in step 63. If the parameter K does not reach $K_0$ (for example, $K_0$=3) in step 64, the parameter K is increased in step 65, a wait operation for a time $\tau_1$ is carried out in step 66, the switch 16 is set so as to select the terminal A in step 68, and the process returns to the step 60. If the parameter K reaches $K_0$ in step 64, the control process stops until the process restarts. The wait time $\tau_1$ is set as longer than the interruption time of the pilot signal necessary for switching the current to spare.

Figure 9:
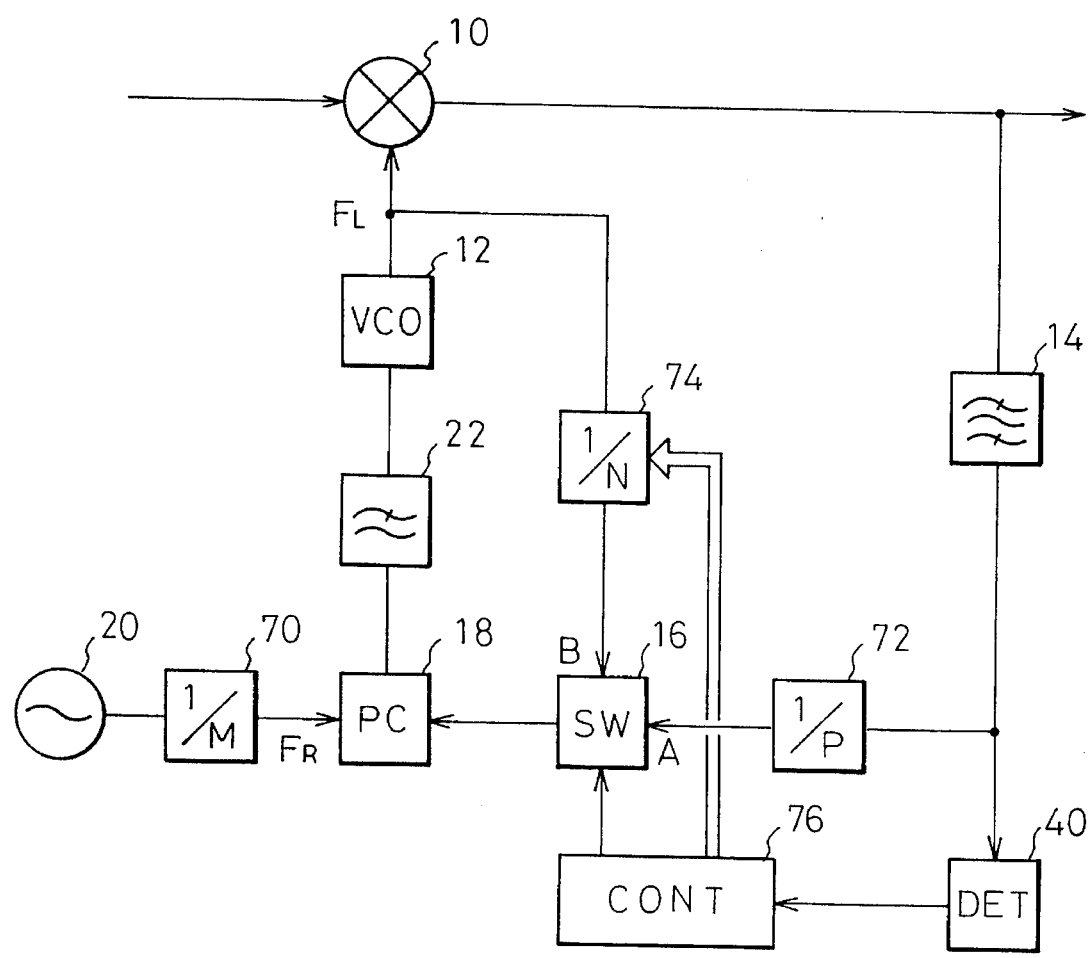
FIG. 9 is a block diagram showing a construction of an AFC circuit as another modification of the AFC circuit of FIG. 2.

FIG. 9 is a block diagram showing a construction of an AFC circuit as another modification of the AFC circuit of FIG. 2. The AFC circuit of FIG. 9 comprises a detector 40 that is the same as that of FIG. 5. In addition, the AFC circuit comprises a frequency divider 70 for dividing the reference frequency from the reference oscillator 20 by an integer M, a frequency divider 72 for dividing the frequency of the pilot signal 10 by an integer P, a variable frequency divider 74 for dividing the frequency of the output signal of the VCO 12 by a variable division number N and a controller 76 for controlling the switch 16 and for giving the division number N to the variable frequency divider 74 in response to the output signal of the detector 40.

Although the pilot signal is again transmitted after an AFC-OFF connection is performed in response to the detection of the interruption of the pilot signal, the pilot signal may not be caught by merely performing AFC-ON connection if a frequency of the pilot signal is altered or is drifted during the interruption. In the AFC circuit of FIG. 9, in order to catch the altered or drifted pilot frequency, the division number of the variable frequency divider 74 is scanned over an assigned range in the AFC-OFF connection until the pilot signal is detected. After the pilot signal is detected, AFC-ON is performed.

In the AFC-off (PLL) connection where the switch 16 selects the terminal B, if a frequency of the one input of the phase comparator 18 is represented by $f_r$, the output frequency $f_L$ of the VCO 12 after establishment of synchronism is represented as $$f_L = N \times f_r \tag{2}$$

where $f_r$ is 1/M of the frequency of the reference oscillator 20. Thus, by varying the division number N of the variable frequency divider 74, $f_L$ can be varied stepwise by $f_r$. For example, in the aforementioned case where $f_L = 1,120$ MHz, N is 1,120,000 if $f_r = 1$ kHz, and $f_L$ becomes 1,120.001 MHz if the N increases by 1. Therefore, the pilot signal can be searched over an assigned range where the pilot signal is expected to exist, by varying the $f_L$ and the variation of the $f_L$ can be performed by varying the N by the controller 76. The 1/P divider 72 is provided for equalizing the frequency of the extracted pilot signal to the $f_r$. Since the equalization of the pilot signal to the $f_r$ can also be performed by bypassing the frequency divider 70 simultaneously with AFC-ON (not shown in figure) instead of using the 1/P divider 72; use of the 1/P divider 72 is not essential.

Figure 10:
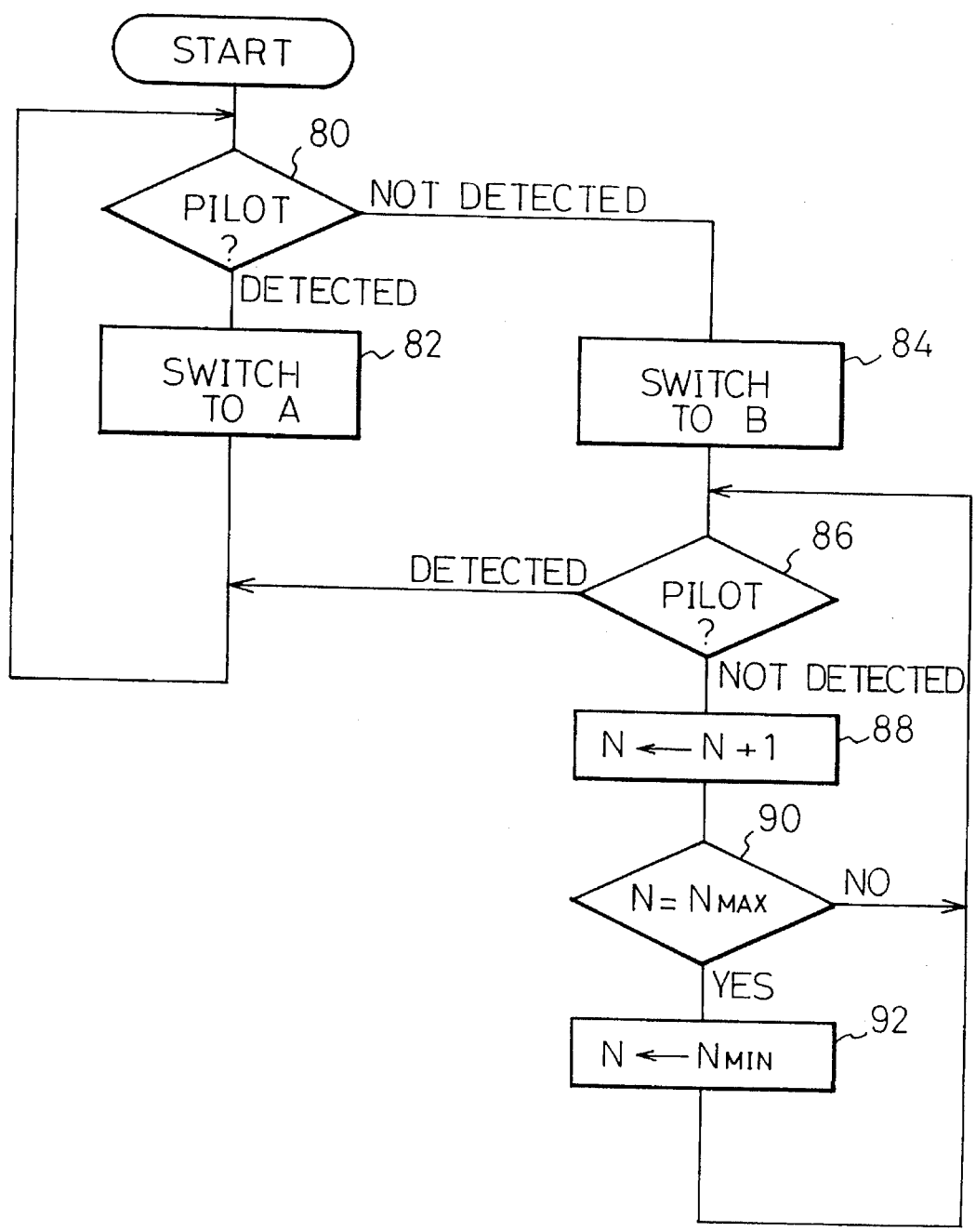
FIG. 10 is a flow chart showing a control process in the controller 76 of FIG. 9.

FIG. 10 is a flow chart showing a control process in the controller 76 of FIG. 9. In step 80, if the pilot signal is detected, the switch 16 is set so as to select the terminal A in step 82. If the pilot signal is not detected in step 80, the switch 16 is set so as to select the terminal B in step 84, and the division number N is scanned within a range from $N_{max}$ to $N_{min}$ in steps 88 to 92 until the pilot signal is detected in step 86. If the pilot signal is detected, the control process returns to step 80.

In the aforementioned process, when the pilot signal is interrupted, PLL loop is automatically constructed, and the division number N is scanned to catch the pilot signal to reconstruct the AFC loop.

Figure 11:
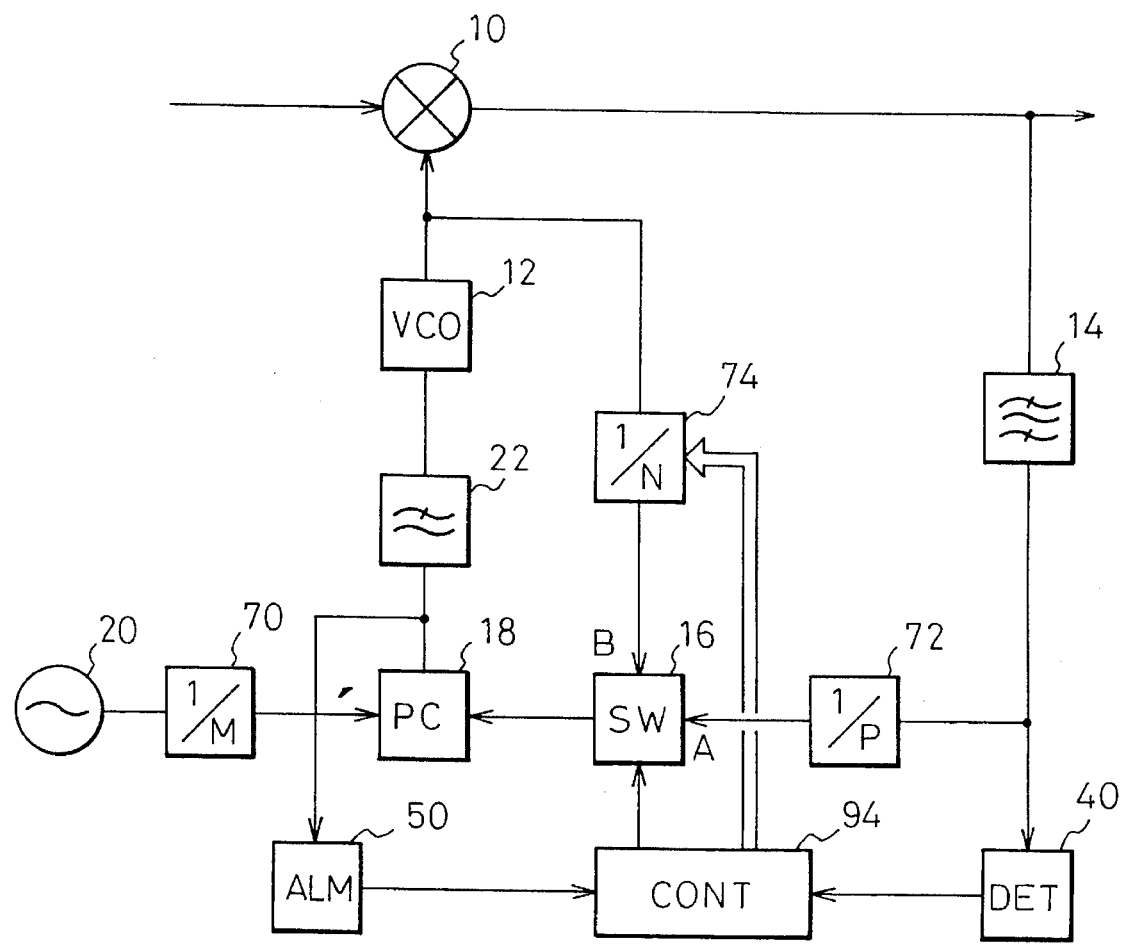
FIG. 11 is a block diagram showing a construction of an AFC circuit as a modification of the AFC circuit of FIG. 9.
Figure 12:
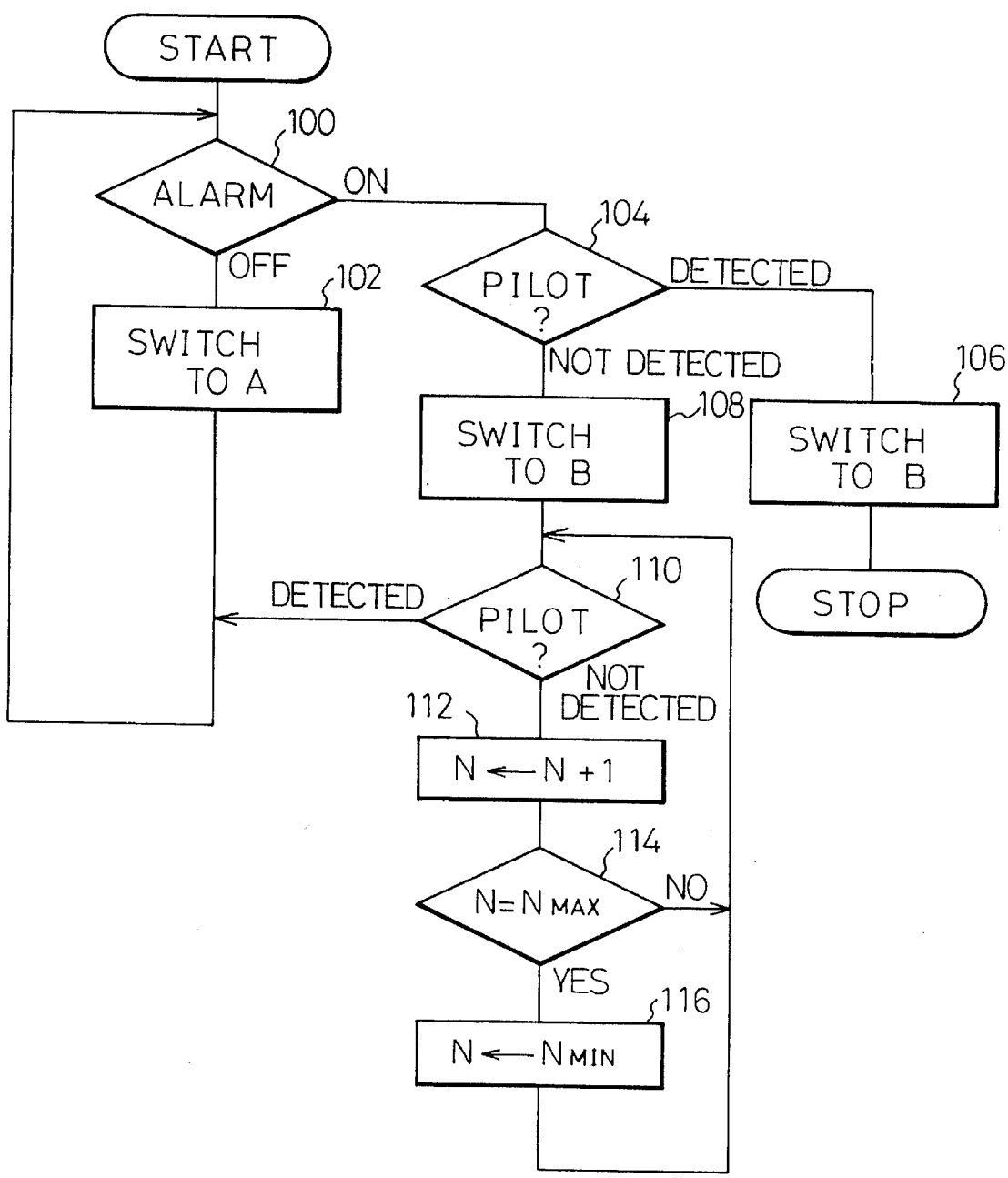
FIG. 12 is a flow chart showing a control process in the controller 94 of FIG. 11.

FIG. 11 is a block diagram showing a construction of an AFC circuit as a modification of the AFC circuit of FIG. 9. The AFC circuit of FIG. 11 further comprises an alarm generator 50 that is the same as that of FIG. 7. A control process in a controller 94 is shown in a flow chart of FIG. 12. In FIG. 12, when the alarm is not output from the alarm generator 50 in step 100, the switch 16 is set so as to select the terminal A in step 102. If the alarm is output in step 100, it is examined whether the pilot signal is detected in detector 40 in step 104. If the pilot signal is detected, the switch 16 is set so as to select the terminal B to construct the PLL in step 106 and the control process stops until the process restarts. If the pilot signal is not detected in step 104, the switch 16 is set so as to select the terminal B and the pilot signal is searched in steps 110 to 116 similar to steps 86 to 92 of FIG. 10.

Figure 13:
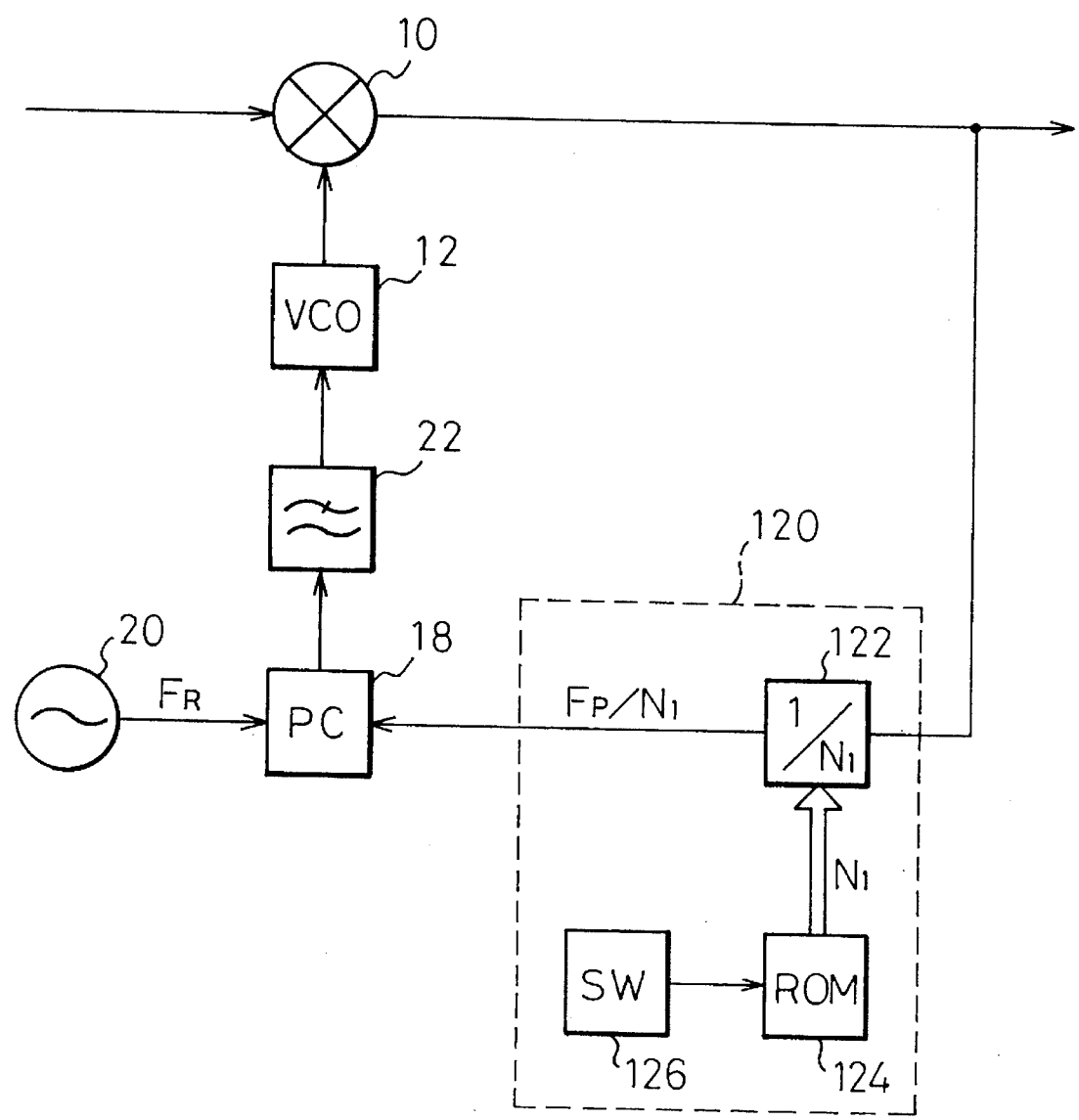
FIG. 13 is a block diagram showing a construction of an AFC circuit according to another embodiment of the present invention.

FIG. 13 is a block diagram showing a construction of an AFC circuit according to another embodiment of the present invention, which deals with a discrepancy or change of the pilot frequency without exchange of the narrow band filters and the reference oscillators or provision of various filters and oscillators, and permits the use of a typical low cost oscillator as the reference oscillator.

The AFC circuit of FIG. 13 comprises a unit 120 for extracting the pilot signal and for converting a frequency of the extracted pilot signal. The unit 120 consists of a variable frequency divider 122, a read only memory 124 and a manual switch 126.

Generally, the level of the pilot signals is higher than that of modulated signals. Therefore, the variable frequency divider 122 selectively divides the frequency of the pilot signal by a division number $N_1$ by having a threshold level lower than the level of the pilot signal and higher than the level of the modulated signals. The division number $N_1$ of the variable frequency divider 122 is supplied from the read only memory 124 and the value $N_1$ read out from the read only memory 124 is controlled by the manual switch 126. After synchronism in the AGC loop is established, the following equation is realized $$f_r = f_o / N_1 \tag{3}$$

i.e., $$f_P = N_1 \cdot f_r \tag{4}$$

Figure 14:
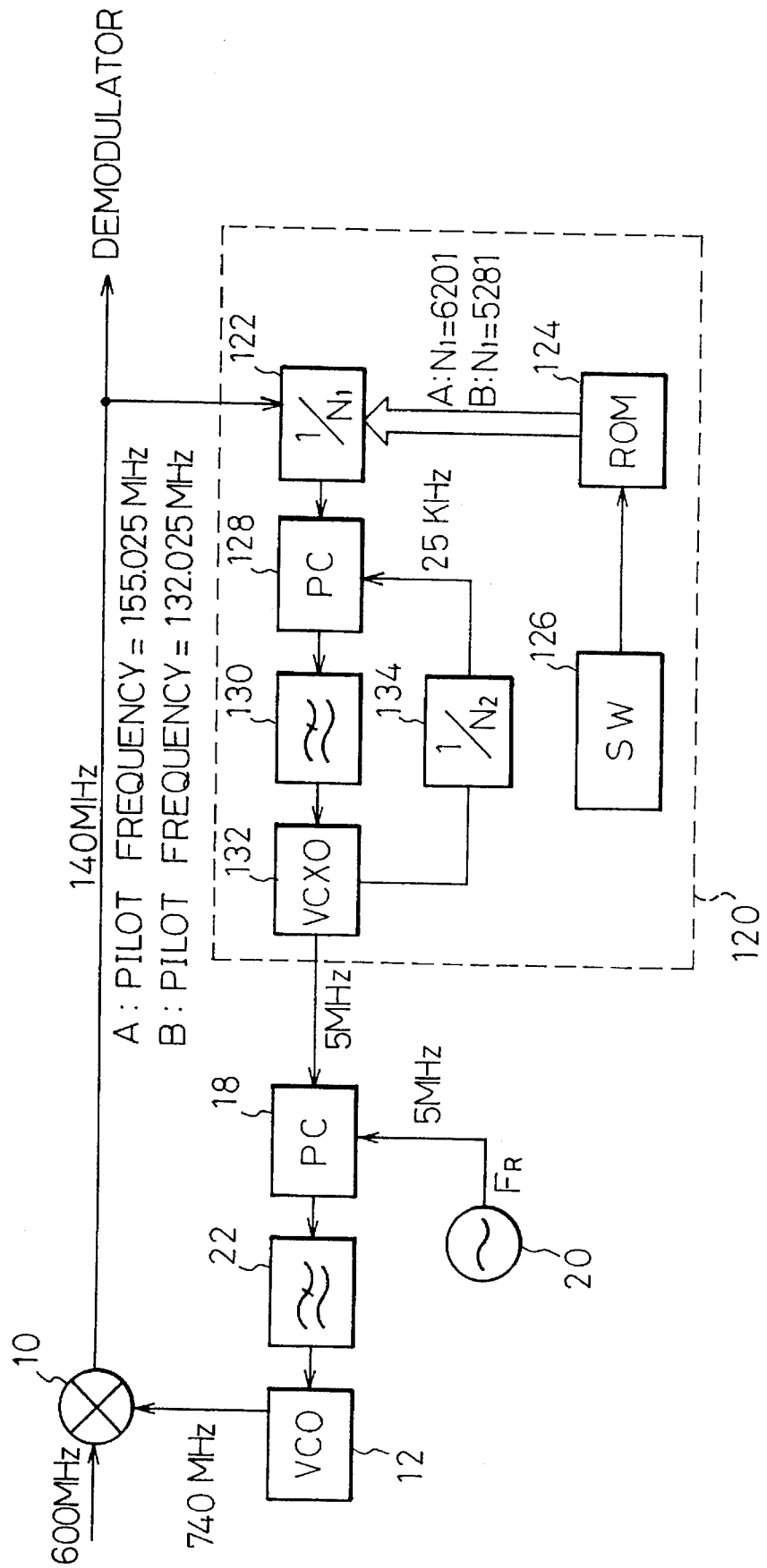
FIG. 14 is a block diagram showing a construction of an AFC circuit as a modification of the AFC circuit of FIG. 13.

Therefore, if the value of $f_r$ is selected from among common divisors of various $f_P$'S, the change of the pilot frequency $f_P$ is realized only by changing the division number $N_1$ by switching the manual switch 126, and a typical value can be used as the FIG. 14 is a block diagram showing a construction of an AFC circuit as a modification of the AFC circuit of FIG. 13.

In the AFC circuit of FIG. 14, the unit 120 further comprises a PLL including consisting of a phase comparator 128, a loop filter 130, a voltage controlled crystal oscillator 132, and a 1/$N_2$ frequency divider 134. The voltage controlled crystal oscillator has high frequency stability and a narrow variable range.

The output signal of the variable frequency divider 122 is fed to one input terminal of the phase comparator 128. An output signal of the phase comparator 128 is input through the loop filter 130 to the voltage controlled crystal oscillator 132 as a control signal therefor. An output signal of the voltage controlled crystal oscillator 132 is fed to one input of the phase comparator 18 as an output of the PLL. The output signal of the voltage controlled crystal oscillator 132 is also fed to the 1/$N_2$ frequency divider 134, whose output signal is fed to the other input terminal of the phase comparator 128.

After synchronism in the PLL is established, a frequency of the output signal of the voltage controlled crystal oscillator 132 becomes $$N_2/N_1 \cdot f_P$$

where $N_2$ is constant and $N_1$ is supplied from the read only memory 124 according to a setting in the switch 126.

After synchronism in the AGC loop is established, the following equation is realized $$f_r = N_2/N_1 \cdot f_P \tag{5}$$

For example, suppose that the frequency and bandwidth of an input signal of a demodulator (the output signal of the frequency converter 10) are 140 MHz and 36 MHz, respectively, and that the frequency of the pilot signal is 155,025 MHz in the 140 MHz band in a normal state (in the case of "A" of FIG. 14). If the division number $N_s$ in the frequency divider 134 is 200, and a typical oscillator of 5 MHz ($f_r = 5$ MHz) is used as the reference oscillator 20, then the pilot signal can be caught by setting the division number $N_1$ to 6201, according to the equation (5). In this situation, frequencies of input signals of the phase comparator 128 are 25 kHz (=155,025 MHz/6201).

When the pilot signal is changed to a spare signal having a frequency of 132.025 MHz (in the case of "B" of FIG. 14), the frequency of the signal supplied from the variable frequency divider 122 to the phase comparator 128 becomes 21.29 kHz (=132,025 MHz/6201), and then the PLL and the AFC loop do not operate. In this case, by changing the division number $N_1$ from 6201 to 5281 for spare, the frequency of the output signal of the frequency divider 122 becomes 25 kHz (=132,025 MHz/5281), and then the PLL and the AFC loop normally operates.

Figure 15:
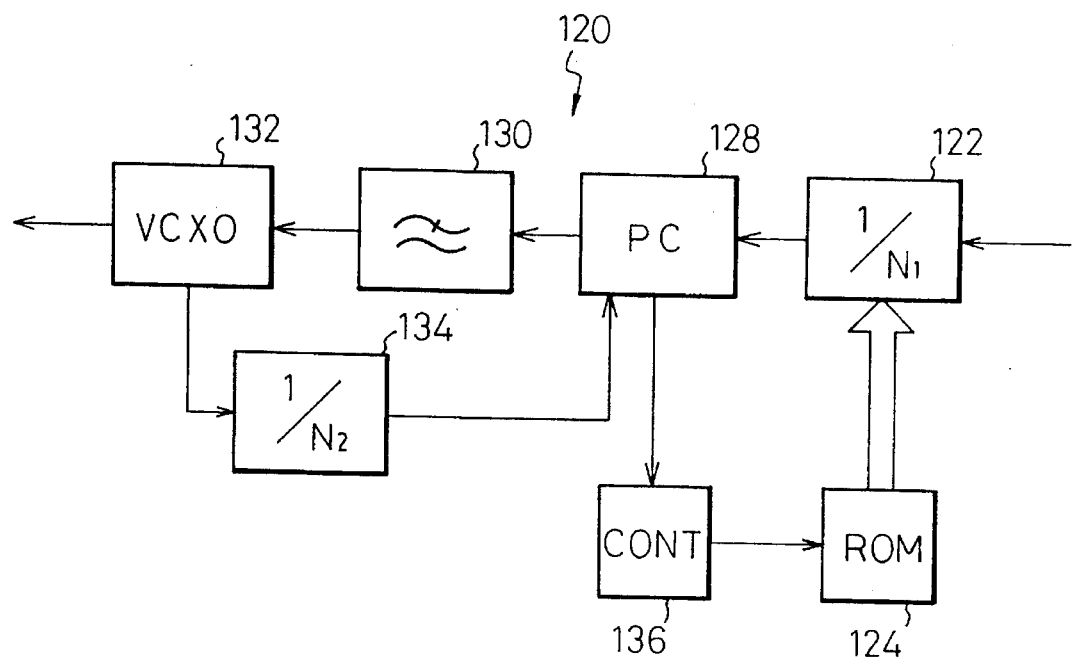
FIG. 15 is a block diagram showing a construction of a unit 120 as a modification of the unit 120 of FIG. 14.

FIG. 15 is a block diagram showing a construction of the unit 120 as a modification of the unit 120 of FIG. 14. The unit 120 of FIG. 15 comprises a controller 136. When the controller 136 detects a pull out signal output from the phase comparator 128, the controller 136 automatically changes the $N_1$ value from current to spare.

Figure 16:
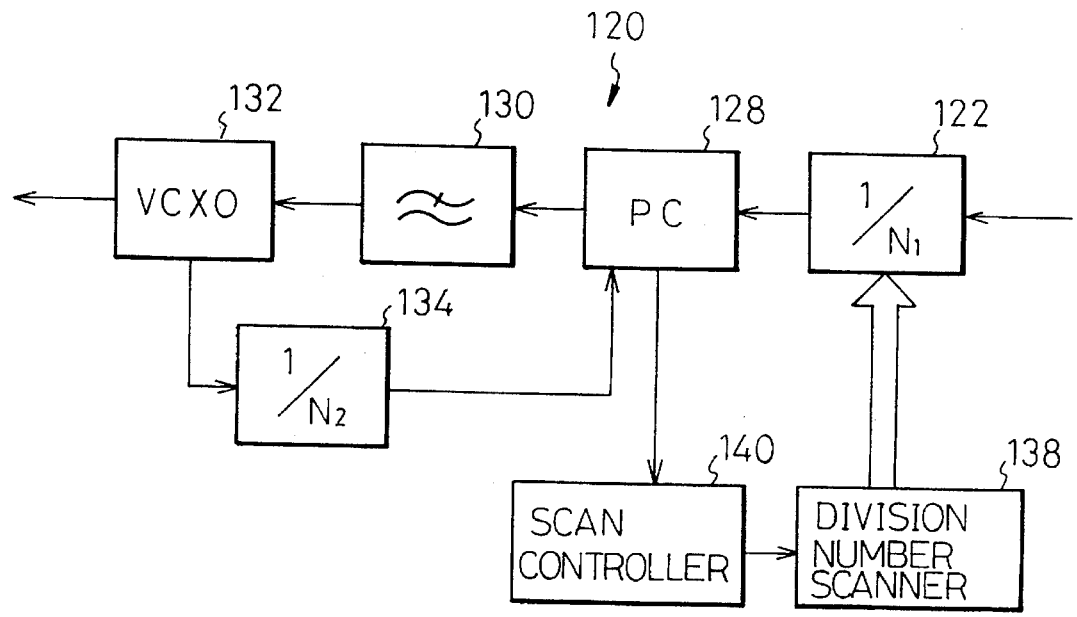
FIG. 16 is block diagram showing a construction of a unit 120 as another modification of the unit 120 of FIG. 14.

FIG. 16 is a block diagram showing a construction of a unit 120 as another modification of the unit 120 of FIG. 14. The unit 120 of FIG. 16 further comprises a division number scanner 138 for scanning the division number $N_1$ of the variable frequency oscillator 122, and a scan controller 140 for controlling the division number scanner 138. When the scan controller 140 detects the pull out signal, the scan controller 140 commands the division number scanner 138 to scan the division number $N_1$ until the pull out signal vanishes. The division number scanner 138 scans the division number $N_1$ of the variable frequency divider 122 over a prescribed range at constant intervals in an increase or decrease direction.

Figure 17:
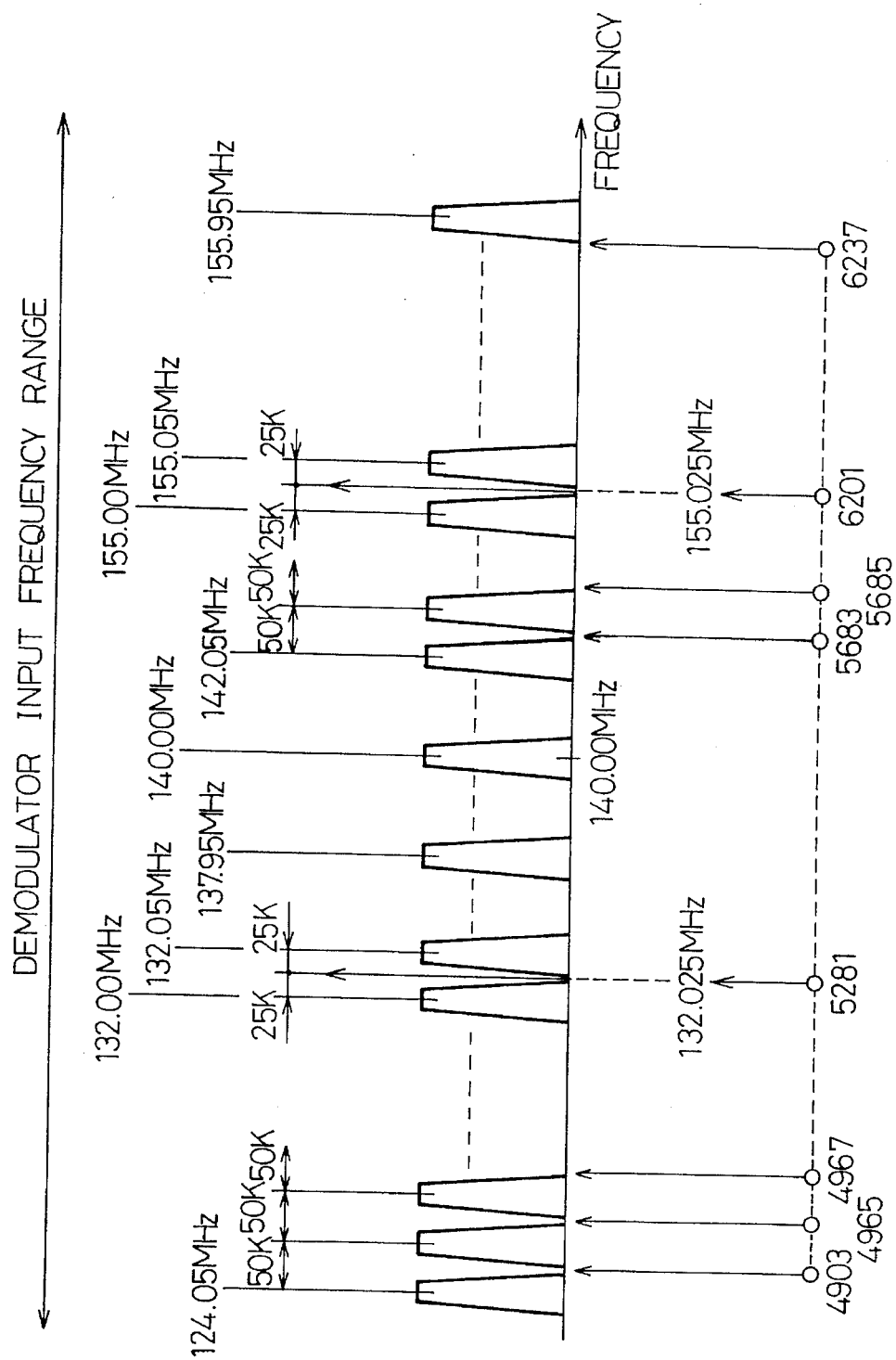
FIG. 17 is a diagram explaining an operation of the AFC circuit of FIG. 16.

FIG. 17 is a diagram explaining an example of operations of the AFC circuit described with reference to FIG. 16. Suppose that a frequency and a bandwidth of an input signal of a demodulator are 140 MHz and 36 MHz, respectively, and that a frequency interval between channels is 50 kHz. If the pilot signal frequency is 132.025 MHz for a current and 155.025 MHz for a spare, the division number $N_1$ is set to 5281 in a normal state.

When the pilot signal frequency is changed to 155.025 MHz for some reason, the pull out signal is output from the phase comparator 128 because the AGC loop cannot follow up out of its variable range. The scan controller 140 detects the pull out signal and the division number $N_1$ is successively changed to 4963, 4965, 4967, . . . by the division number scanner. The target frequency, which is capable of being caught by the AFC, is also changed to values such as 124.075, 124.125, 124.175, . . . , according to the value of $N_1$. During this period, the phase comparator 128 continues outputting the pull out signal. When the division number $N_1$ becomes 6201, the target frequency becomes equal to the pilot signal frequency 155.025 MHz. Then the pilot signal is caught by the AFC, and after synchronism has been established, the pull out signal vanishes. As the pull out signal vanishes, the scan controller 140 commands the division number scanner 138 to stop scanning, and the AFC continues operating.

Figure 18:
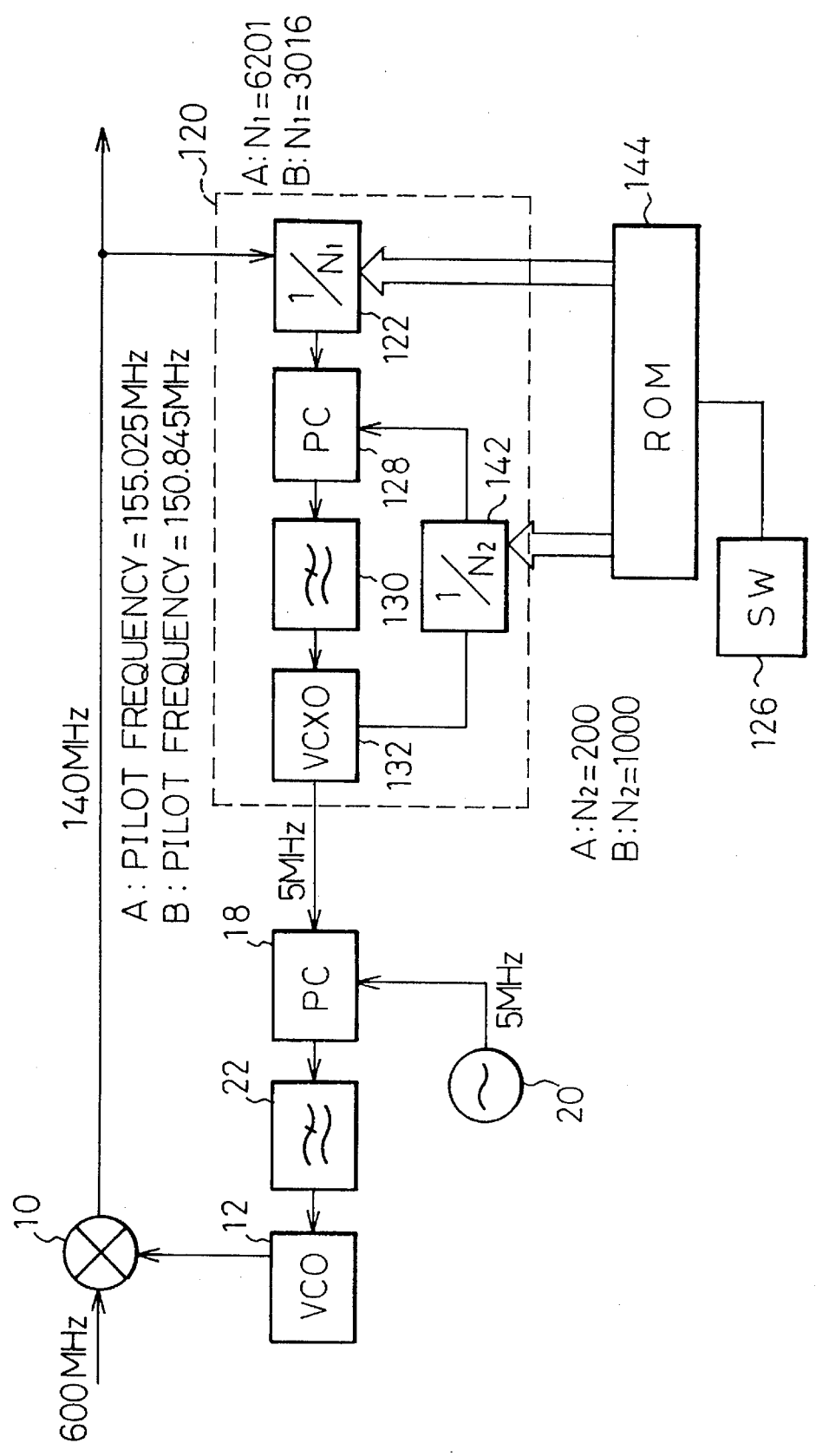
FIG. 18 is a block diagram showing a construction of an AFC circuit as another modification of the AFC circuit of FIG. 14.

FIG. 18 is a block diagram showing a construction of an AFC circuit as another modification of the AFC circuit of FIG. 14. The AFC circuit of FIG. 18 comprises a variable frequency divider 142 instead of the frequency divider 134 of FIG. 14. The read only memory 144 retains a division number $N_1$ for the variable frequency divider 142 as well as the division number $N_1$ for the variable frequency divider 122.

Figure 19:
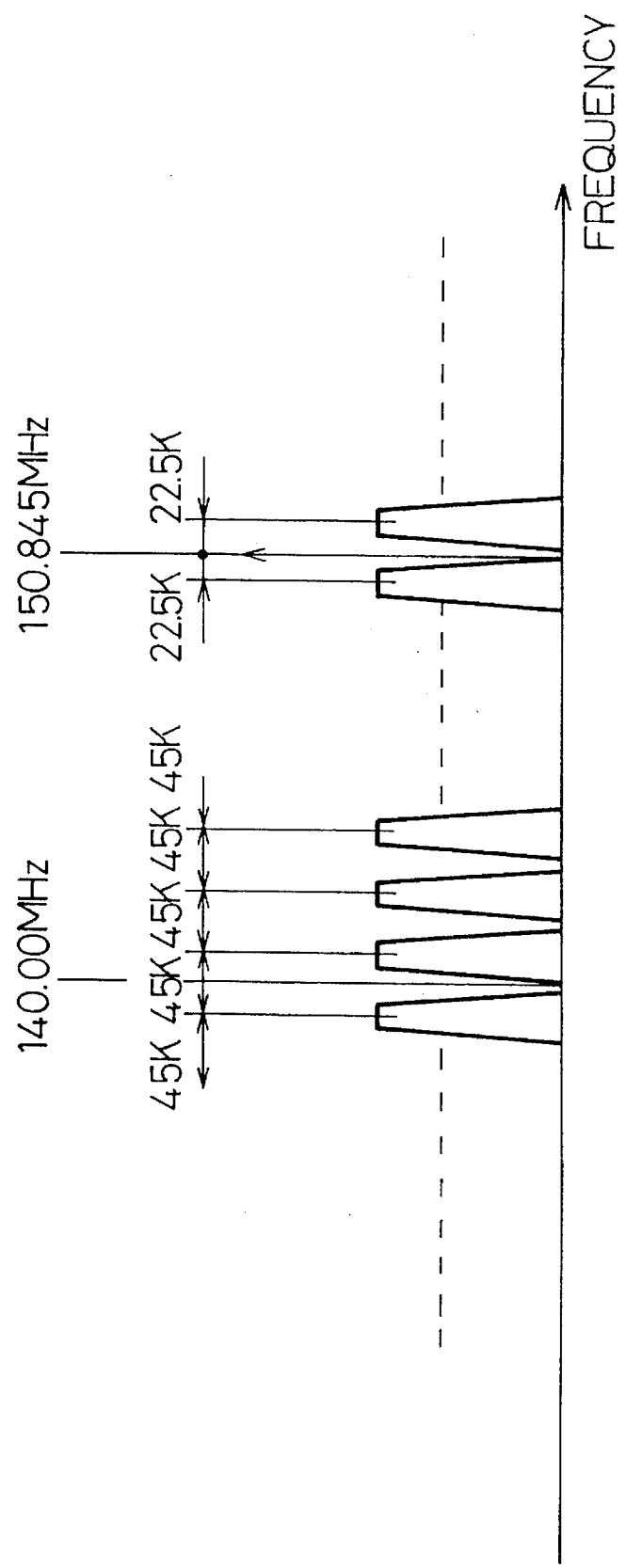
FIG. 19 is a diagram for explaining an operation of the AFC circuit of FIG. 18.

Suppose that the communication channels are disposed at channel intervals of 50 kHz and the pilot signal frequency is 155.025 MHz in a system 1, as shown in FIG. 17, and that the channel intervals are 45 kHz and the pilot signal frequency is 15.0845 MHz in a system 2, as shown in FIG. 19. The frequency of the reference signal is 5 MHz.

In the system 1, the pilot signal having the frequency of 155.025 MHz can be caught by the AFC by setting as $N_1$=6201 and $N_2$=200 (the case of "A" in FIG. 18). Even when the frequency of the pilot signal is changed, the changed frequency can be dealt with by changing the target frequency by a unit of 50 kHz by changing the division number $N_1$. In the system 2, the pilot signal having the frequency of 150.845 MHz can be caught by the AFC by setting $N_1$=30169 and $N_2$=1000 (the case of "B" in FIG. 18). Even when the frequency of the pilot signal is changed, the changed frequency can be dealt with by changing the target frequency by a unit of 45 kHz by changing the division number $N_1$.

The replacement of the frequency divider 134 with the variable frequency divider 142 is also possible in the AFC circuits described with reference to FIGS. 15 and 16. Furthermore, the change of the $N_2$ is possible in the manual and automatical process.

We claim:

1. An automatic frequency control circuit in a radio communication apparatus, said circuit being supplied with input signals, comprising:

frequency conversion means for converting the input signals into converted signals having frequencies different than the frequencies of the input signals by mixing a local oscillation signal with the input signals;

extraction means for extracting and outputting a pilot signal having a specific frequency from the converted signals;

oscillation means for outputting a reference signal having a reference frequency;

phase comparison means having first and second input terminals for comparing a first frequency and a first phase of the reference signal input to the first input terminal with a second frequency and a second phase of a selected signal input to the second input terminal, to output a comparison result;

variable oscillation means for outputting the local oscillation signal having a frequency varying in accordance with the comparison result to the frequency conversion means;

frequency division means for dividing the frequency of the local oscillation signal by a division number to the output a frequency-divided local oscillation signal; and switch means for selecting the pilot signal when the pilot signal is included in the converted signals and for selecting the frequency-divided local oscillation signal when the pilot signal is not included in the converted signals, to output the selected signal to the second input terminal of the phase comparison means.

2. An automatic frequency control circuit as claimed in claim 1, further comprising:

alarm generation means for generating an alarm signal based on whether the comparison result has an abnormal value; and control means for controlling the switch means so as to select the frequency-divided local oscillation signal when the alarm generation means generating the alarm signal.

3. An automatic frequency control circuit as claimed in claim 1, further comprising:

detection means for detecting a presence of the pilot signal output from the extraction means; and control means for controlling the switch means so as to select the frequency-divided local oscillation signal when the detection means does not detect the presence of the pilot signal.

4. An automatic frequency control circuit as claimed in claim 3, wherein the frequency division means includes a variable frequency divider having a variable division number, and wherein the control means includes a controller scanning the variable division number of the variable frequency divider after controlling the switch means so as to select the frequency-divider local oscillation signal until the detection means detects the presence of the pilot signal.

5. A frequency control circuit in a radio communication apparatus, said circuit being supplied with input signals, comprising:

frequency conversion means for converting the input signals into converted signals having frequencies different than the frequencies of the input signals by mixing a local oscillation signal with the input signals;

extraction means for extracting and outputting a pilot signal having a specific frequency from the converted signals;

oscillation means for outputting a reference signal having a reference frequency;

phase comparison means having first and second input terminals for comparing a first frequency and a first phase of the reference signal input to the first input terminal with a second frequency and a second phase of a selected signal input to the second input terminal, to output a comparison result;

variable oscillation means for outputting the local oscillation signal having a frequency varying in accordance with the comparison result to the frequency conversion means;

frequency division means for dividing the frequency of the local oscillation signal by a division number to output a frequency-divided local oscillation signal;

switch means for selecting the pilot signal when the pilot signal is included in the converted signals and for selecting the frequency-divided local oscillation signal when the pilot signal is not included in the converted signals, to output the selected signal to the second input terminal of the phase comparison means;

filter means for eliminating high frequency components from the comparison result output from the phase comparison mean, to output a comparison result not including the high frequency components to the variable oscillation means; and control means for controlling a response characteristic of the filter means based on a selection in the switch means.

6. An automatic frequency control circuit in a radio communication apparatus, said circuit being supplied with input signals, comprising:

frequency conversion means for converting the input signals into converted signals having frequencies different than the frequencies of the input signals by mixing a local oscillation signal with the input signals;

extraction means for extracting and outputting a pilot signal having a specific frequency from the converted signals;

oscillation means for outputting a reference signal having reference frequency;

phase comparison means having first and second input terminals for comparing a first frequency and a first phase of the reference signal input to the first input terminal with a second frequency and a second phase of a selected signal input to the second input terminal, to output a comparison result;

variable oscillation means for outputting the local oscillation signal having a frequency varying in accordance with the comparison result to the frequency conversion means;

frequency division means for dividing the frequency of the local oscillation signal by a division number to output a frequency-divided local oscillation signal;

switch means for selecting the pilot signal when the pilot signal is included in the converted signals and for selecting the frequency-divided local oscillation signal when the pilot signal is not included in the converted signals, to output the selected signal to the second input terminal of the phase comparison means;

alarm generation means for generating an alarm signal based on whether the comparison result has an abnormal value; and control means for controlling the switch means so as to select the frequency-divided local oscillation signal when the alarm generation means generating the alarm signal, wherein the control means controls the switch means so as to select the pilot signal after a predetermined time passes after the switch means selects the frequency-divided local oscillation signal.

7. An automatic frequency control circuit in a radio communication apparatus, said circuit being supplied with input signals, comprising;

frequency conversion means for converting the input signals into converted signals having frequencies different than the frequencies of the input signals by mixing a local oscillation signal with the input signals;

extraction means for extracting and outputting a pilot signal having a specific frequency from the converted signals;

oscillation means for outputting a reference signal having a reference frequency;

phase comparison means having first and second input terminals for comparing a first frequency and a first phase of the reference signal input to the first input terminal with a second frequency and a second phase of a selected signal input to the second input terminal, to output a comparison result;

variable oscillation means for outputting the local oscillation signal having a frequency varying in accordance with the comparison result to the frequency conversion means;

frequency division means for dividing the frequency of the local oscillation signal by a division number to output a frequency-divided local oscillation signal;

switch means for selecting the pilot signal when the pilot signal is included in the converted signals and for selecting the frequency-divided local oscillation signal when the pilot signal is not included in the converted signals, to output the selected signal to the second input terminal of the phase comparison means;

detection means for detecting a presence of the pilot signal output from the extraction means; and control means for controlling the switch means so as to select the frequency-divided local oscillation signal when the detection means does not detect the presence of the pilot signal, wherein:

the frequency division means includes a variable frequency divider having a variable division number, the control means includes a controller scanning the variable division number of the variable frequency divider after controlling the switch means so as to select the frequency-divided local oscillation signal until the detection means detects the presence of the pilot signal, and an alarm generation means for generating an alarm signal based on whether the comparison result has an abnormal value, wherein the control means controls the switch means so as to select the frequency-divided local oscillation signal when the alarm generation means generates the alarm signal and when the detection means does not detect the presence of the pilot signal.

8. An automatic frequency control circuit supplied with input signals including a pilot signal comprising:

frequency conversion means for converting the input signals into converted signals having frequencies different than the frequencies of the input signals by mixing a local oscillation signal with the input signals;

a first frequency divider for selectively dividing a frequency of the pilot signal by a first division number to output a frequency-divided pilot signal;

oscillation means for outputting a reference signal having a reference frequency;

a first phase comparator for comparing a frequency and a phase of the reference signal with a frequency and a phase of the frequency-divided pilot signal, to output a comparison result;

a first variable oscillator for outputting the local oscillation signal having a frequency varying in accordance with the comparison result to the frequency conversion means; and a phase lock loop means coupled between the first frequency divider and the phase comparison means, the phase lock loop means including:

a second phase comparator having first and second input terminals, for comparing a frequency and a phase of the frequency-divided pilot signal input to the first input terminal with a frequency and a phase of a frequency-divided signal input to the second input terminal, to output a comparison result;

a second variable oscillator for outputting a signal having a frequency varying in accordance with the comparison result output from the second phase comparator, to the first phase comparator; and a second frequency divider for dividing a frequency of the output signal of the second variable oscillator by a second division number, to output the frequency-divided signal to the second input terminal of the second phase comparator.

9. An automatic frequency control circuit as claimed in claim 8, further comprising means for setting the first division number at the first variable frequency divider.

10. An automatic frequency control circuit as claimed in claim 8, further comprising a control means for altering the first division number when a pull out signal is output from the second phase comparator.

11. An automatic frequency control circuit as claimed in claim 8, further comprising means for scanning the first division number when a pull out signal is output from the second phase comparator until the pull out signal is not output from the second phase comparator.

12. An automatic frequency control circuit as claimed in claim 8, further comprising means for setting the second division number at the second variable frequency divider.

13. A method for performing automatic frequency control in a receiver, comprising the steps of:

a) receiving an input signal;

b) mixing the input signal with a local oscillation signal to generate a converted signal;

c) determining whether a pilot signal is present in the converting signal;

d) frequency-dividing the local oscillation signal to generate a frequency-divided local oscillation signal;

e) selecting one of the pilot signal the frequency-divided local oscillator signal, based on said step (c), to generate a selected signal;

f) generating a reference signal;

g) comparing the selected signal and the reference signal to generate a comparison result; and h) generating the local oscillation signal based on the comparison result.

* * * * *

UNITED STATES PATENT AND TRADEMARK OFFICE
CERTIFICATE OF CORRECTION

PATENT NO. : 5,548,811
DATED : August 20, 1996
INVENTOR(S) : Yoshiaki KUMAGAI, et al.

It is certified that error appears in the above-indentified patent and that said Letters Patent is hereby corrected as shown below:

Col. 1, line 44, after "lower intermediate frequency signal" insert --,--;

line 45, after "respectively" insert --,--.

Col. 4, line 61, after "intermediate frequency signal" insert --,--.

Col. 5, line 32, delete "$n_p$" and insert --$f_p$--;
line 42, after "to" insert --$f_r$--;
line 62, delete "10".

Col. 6, line 28, delete "10";
line 62, delete "10".

Col. 8, line 26, delete "fp'S" and insert --$f_p$'s--;
line 29, after "the" insert --$f_r$.--.
line 66, delete "$N_s$" and insert --$N_2$--.

Col. 9, line 65, delete "$N_1$" and insert --$N_2$--.

Col. 14, claim 13, line 11, delete "oscillator" and insert-- oscillation--.

Signed and Sealed this

Third Day of December, 1996

BRUCE LEHMAN

*Attest:*

*Attesting Officer*    *Commissioner of Patents and Trademarks*